United States Patent
Chari et al.

(10) Patent No.: US 8,737,545 B2
(45) Date of Patent: May 27, 2014

(54) RECEIVER CHAIN GAIN SELECTION

(75) Inventors: Sujai Chari, Burlingame, CA (US); Ssu-Pin Ma, San Jose, CA (US)

(73) Assignee: Posedge Inc., Sunnyvale, CA (US)

( * ) Notice: Subject to any disclaimer, the term of this patent is extended or adjusted under 35 U.S.C. 154(b) by 252 days.

(21) Appl. No.: 13/326,248

(22) Filed: Dec. 14, 2011

(65) Prior Publication Data

US 2013/0156140 A1    Jun. 20, 2013

(51) Int. Cl.
*H04L 27/08* (2006.01)
(52) U.S. Cl.
USPC .......................................... 375/345
(58) Field of Classification Search
USPC ................... 375/245, 316, 346, 348, 350, 345
See application file for complete search history.

(56) References Cited

U.S. PATENT DOCUMENTS

| 7,215,269 | B2 * | 5/2007 | Lee et al. ................ 341/143 |
| 7,792,228 | B2 * | 9/2010 | Yoon ...................... 375/350 |
| 8,243,861 | B2 * | 8/2012 | Mostafa ................... 375/346 |
| 2006/0291428 | A1 * | 12/2006 | Filipovic ................. 370/335 |
| 2009/0191907 | A1 | 7/2009 | McCallister et al. |
| 2011/0026570 | A1 * | 2/2011 | Feng et al. ................ 375/224 |
| 2011/0053522 | A1 | 3/2011 | Rofougaran et al. |

* cited by examiner

*Primary Examiner* — Khanh C Tran
(74) *Attorney, Agent, or Firm* — Brian R. Short

(57) ABSTRACT

Apparatuses, methods and systems of selecting a gain setting of a receiver chain are disclosed. One method includes bypassing a filter portion of the receiver chain and sampling a bypass receive signal while the filter portion of the receiver chain is bypassed. If the sampled bypass receive signal is determined to be saturated greater than a threshold, then selecting a gain setting of the receive chain as a function of the saturation. Further, the filter portion of the receive chain is included while sampling a receive signal with the selected gain setting.

21 Claims, 8 Drawing Sheets

RECEIVER CHAIN GAIN SELECTION

FIELD OF THE DESCRIBED EMBODIMENTS

The described embodiments relate generally to wireless communications. More particularly, the described embodiments relate to methods and apparatuses for selecting gain settings of a receiver chain.

BACKGROUND

A typical wireless receiver has several gain stages in a radio frequency (RF) chain to enhance the received signal so that a receiver analog-to-digital converter (ADC) can digitize the signal of interest (of the receive signal) with sufficient integrity to allow for digital processing to demodulate signal(s) of interest. Typically, there is an automatic gain control block that measures the ADC output and accordingly adjusts the RF/analog gain settings to ensure a certain target signal level at the ADC input (which typically provides a tradeoff between minimizing saturation and minimizing quantization error).

Generally, it is advantageous to use higher gain settings in receiver chain blocks such as the LNA (low noise amplifier) that are located at the beginning of the RF chain versus the gain blocks such as the VGA (variable gain amplifier) at the end of the chain near the ADC. Such a configuration minimizes thermal noise and results in improved signal quality. However, if the LNA settings are too high, saturation can result and signal integrity is compromised. When there is no adjacent channel or out-of-band interference, the ADC output can be monitored to detect the likelihood of saturation. However, when there is adjacent channel interference, there may be saturation at the LNA and the subsequent analog low pass filters may then suppress the signal power resulting in a low signal measurement at the ADC output thereby preventing accurate detection of saturation.

It is desirable to have methods and apparatuses for selecting gain settings of receiver chains to alleviate distortion to receive signals due to saturation of components within the receiver chain.

SUMMARY

An embodiment includes a method of selecting a gain setting of a receiver chain. The method includes bypassing a filter portion of the receiver chain and sampling a bypass receive signal while the filter portion of the receiver chain is bypassed. If the sampled bypass receive signal is determined to be saturated greater than a threshold, then a gain setting of the receive chain is selected as a function of the saturation. Finally, the filter portion of the receive chain is included while sampling a receive signal with the selected gain setting.

Another embodiment includes a receiver. The receiver includes a receiver chain, wherein the receiver chain includes a filter portion, a receiver sampler, and a controller. The controller is operative to control bypassing of the filter portion, and receiving samples of the receiver sampler. If a receive signal sampled while the filter portion is bypassed is determined to be saturated greater than a threshold, then a gain setting of the receive chain is selected as a function of the saturation. The controller is further operative to include the filter portion of the receive chain and set receiver chain to the selected gain setting while receiving a receive signal.

Other aspects and advantages of the described embodiments will become apparent from the following detailed description, taken in conjunction with the accompanying drawings, illustrating by way of example the principles of the described embodiments.

DETAILED DESCRIPTION

The embodiments described include methods and apparatuses for setting or adjusting one or more variable gains of a receiver chain of a receiver or transceiver. The embodiments include measurements and/or characterizations of receive signals with and without receiver chain filtering, and selecting/adjusting the gain of the receiver chain accordingly.

Figure 1:
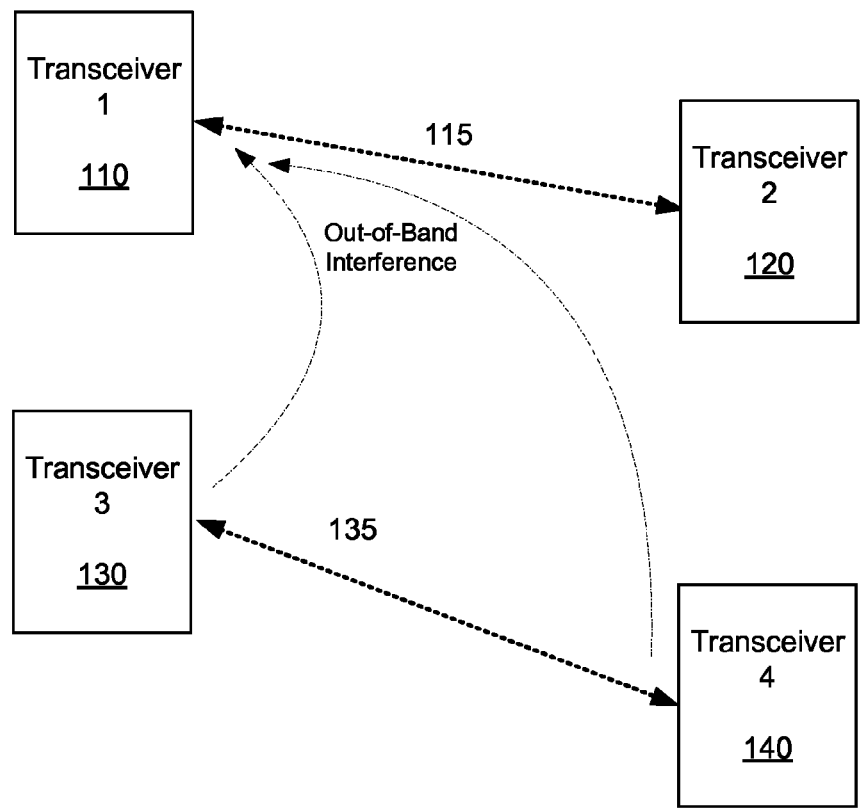
FIG. 1 shows an example of multiple transceivers that can suffer from out-of-channel interference.

FIG. 1 shows an example of multiple transceivers that can suffer from out-of-channel interference. A first transceiver 110 wirelessly communicates with a second transceiver 120, and a third transceiver 130 wirelessly communicates with a fourth transceiver 140. If, for example, the wireless communications of the first transceiver 110 wirelessly communicates with a second transceiver 120 is in a frequency channel that is close (for example, an adjacent channel) with the wireless communication between the third transceiver 130 and the fourth transceiver 140, out-of-band interference can result.

Figure 2:
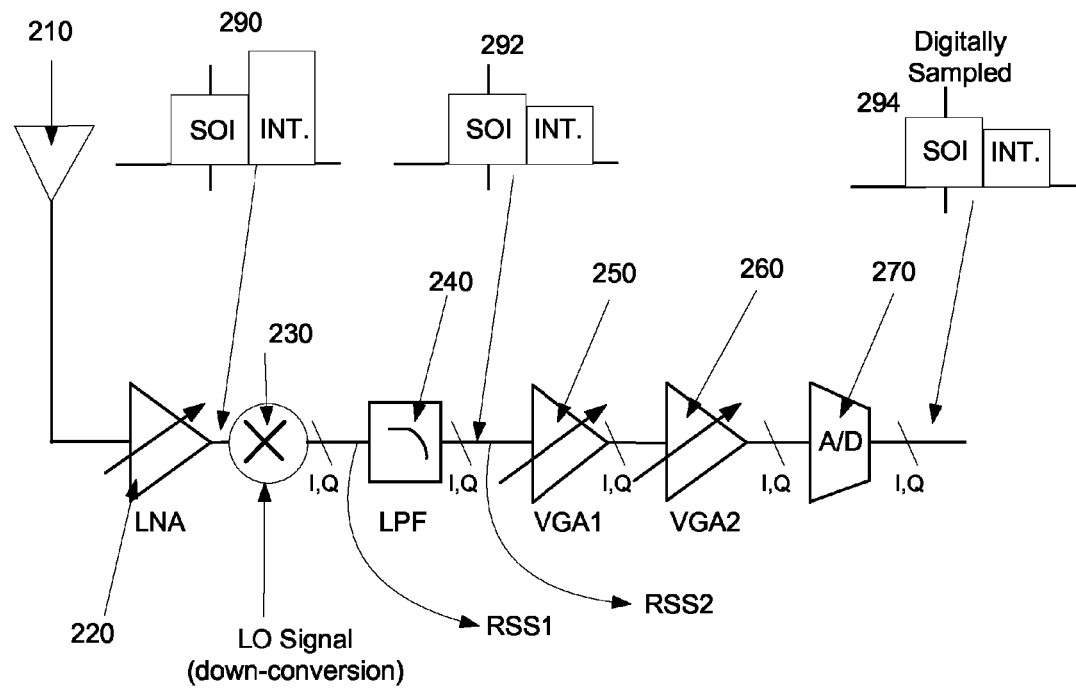
FIG. 2 shows an example of a receiver chain that include out-of-band interference

FIG. 2 shows an example of a receiver chain that includes out-of-band interference. The receiver receives a signal through an antenna 210. The received signal is adjustably amplified by a low noise amplifier (LNA) 220, and frequency down-converted to baseband by a local oscillator (LO) with a down-conversion mixer 230. The baseband receive signal is filtered with a low pass filter (LPF) 240 and the signal level of the base band signal is adjusted by variable gain amplifiers (VGA1, VGA2) 250, 260. Finally, the analog base band signal is sampled by an analog-to-digital converter (ADC) 270. As shown, the output of the down-conversion mixer 230 generally includes I and Q components that are ninety degrees out of phase from each other.

A frequency spectrum representation 290 shows the interference signal (INT.) being substantial as compared to the signal of interest (SOI), which suggests that the LNA 220 is saturated due to too great of a signal at the output of the LNA 220. Generally, the LNA 220 starts in a high-gain state which can be adjusted to a lower-gain state if the LNA 220 is determined to be saturated. If the LNA 220 is saturated, the LPF 240 disguises the saturated state of the LNA 220 by filtering the interference signal as shown by the frequency spectrum

292. The VGA(s) 250, 260 then amplify both the SOI and the INT signals before being sampled by the ADC 270 as depicted by the digital frequency spectrum representation 294.

One method/implementation for identifying saturation of the LNA 220 (or other devices in the receiver chain) includes adding measurements at various points (depicted by receive signal strength measurements RSS1, RSS2) along the RF/analog receiver chain to allow independent assessments of saturation probability at each point. By comparing the measurements at each point, the gain stage where saturation may be occurring can be diagnosed and the gain partitioning among the stages may be adjusted to prevent saturation. However, this implementation requires special circuitry to probe various points in the RF chain and additional gain measurement modules (for example, through the use of additional ADCs). For systems with multiple receive chains like MIMO (Multiple Input Multiple Output) systems, the added complexity can increase further since each chain may have independent gain control resulting in additional signal measurement blocks for each chain. At least some of the described embodiments perform saturation detection/determination without the addition of signal level/power measurements at various points along the RF chain. Instead, an existing ADC output is used to ascertain the gain stage (device) at which saturation might be occurring.

Figure 3:
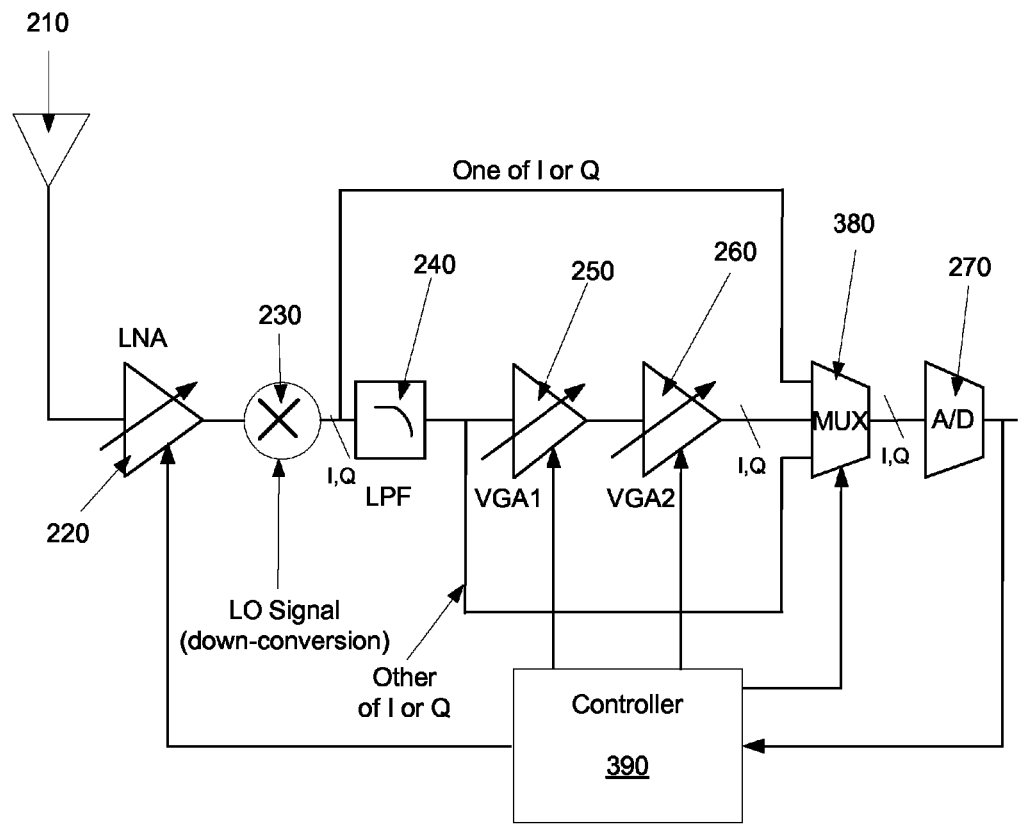
FIG. 3 shows a receiver chain that adjusts its gain according to an embodiment.

FIG. 3 shows a receiver chain that adjusts its gain according to an embodiment. Once the received RF signal is frequency down-converted by the mixer 230, the baseband signal includes an in-phase (I) and quadrature (Q) component. Typically, two ADCs are used in the baseband to digitize the signal, one for the I signal and one for the Q signal. That is, while a single ADC 270 is shown, in reality the ADC 270 is typically two ADC(s), wherein one ADC receives the I component and one ADC receives the Q component.

For the purposes of AGC (control of the gain of the LNA and the VGA(s), where the main objective is to assess the power of the signal and infer possible saturation at various stages in the analog/RF receiver chain, the I or the Q component may provide sufficient information to achieve this objective. Therefore, it may not be necessary to use both components for this purpose since the power statistics of both components are typically similar due to the random phase distribution of most received wireless signals.

At the beginning of reception of wireless signals/packets, at least some embodiments of the receiver are configured such that different points in the analog chain are represented by the I and Q components respectively. For instance, the mixer output before the analog filter (LPF 240) may be connected directly to the I signal connected to the ADC (as will be shown and described, and embodiments includes a multiplexer to selecting this path during AGC or the normal path which feeds the output of the baseband VGAs after AGC is completed) and the analog filter output may be connected directly to the Q signal coming to the ADC.

If the measured/sampled I component indicates saturation (saturation and degrees of saturation will be described later) and the Q component indicates the presence of a low signal level (below a threshold), then it is likely that the LNA is saturating due to out of band interference. Hence, the gain setting of the LNA should be reduced to prevent saturation even if it results in higher thermal noise (as the LNA reduced gain would be compensated with a higher gain later in the receive chain which degrades the noise figure). If the measured/sampled I component does not indicate saturation, then the Q component can be effectively used to determine the overall gain setting.

As shown in FIG. 3, a multiplexer 380 receives one of the I or the Q channel before the LPF 240 and the other of the I or the Q channel after the LPF 380. A controller 390 selects which of the I or Q channel are being sampled by the ADC 270, and therefore, the controller 390 is able to obtain a representation of the receive signal both before and after the LPF 240. Based on the sampled representations of the received signal both before and after the LPF 240, the controller 390 is able to assess which if any of the devices within the receiver chain are saturated, and can adjust the gain of the LNA 220 and/or the VGA(s) 250, 260 to reduce or minimize the saturation of the devices.

Figure 4:
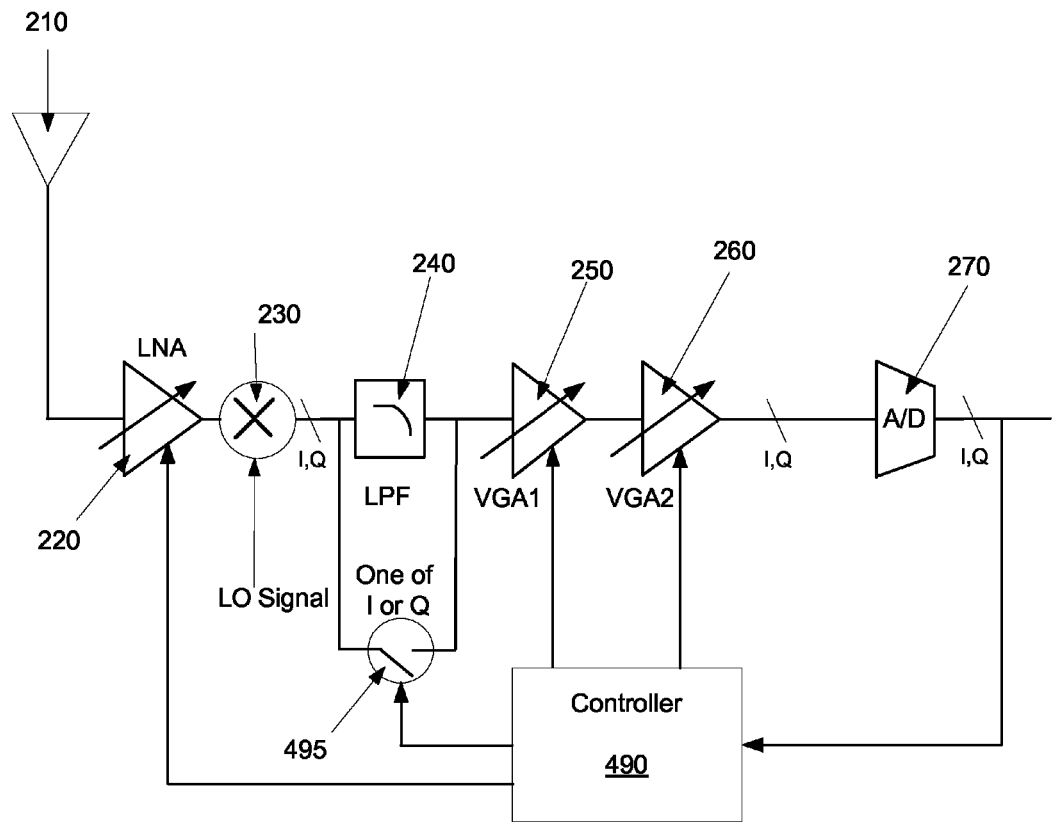
FIG. 4 shows a receiver chain that adjusts its gain according to another embodiment.

FIG. 4 shows a receiver chain that adjusts its gain according to another embodiment. For this embodiment, the controller 490 controllably bypasses the LPF 240 using a switch 495, allowing the controller 490 to obtain representations of the received signal both with and without the LPF 240 present. The representation can be of only one of either I or Q channel receive signals.

In this embodiment, one of I or Q signals received at the ADC 270 contains the unfiltered out-of-band interference signal (due to bypass of the LPF) while the other of the I or Q signals received at the ADC 270 contains an attenuated/filtered (and hence weaker) out-of-band interference signal component. The advantage of this embodiment over the embodiment shown in FIG. 3 is that there is less complexity due to the replacement of a 3 way MUX (380) with a simple switch (495). Another advantage is that if the determination is made that the LNA is not causing saturation, the power measurement from the signal component which has not bypassed the LPF can be immediately used to re-adjust the LNA/VGA settings to achieve target levels at ADC.

Figure 5:
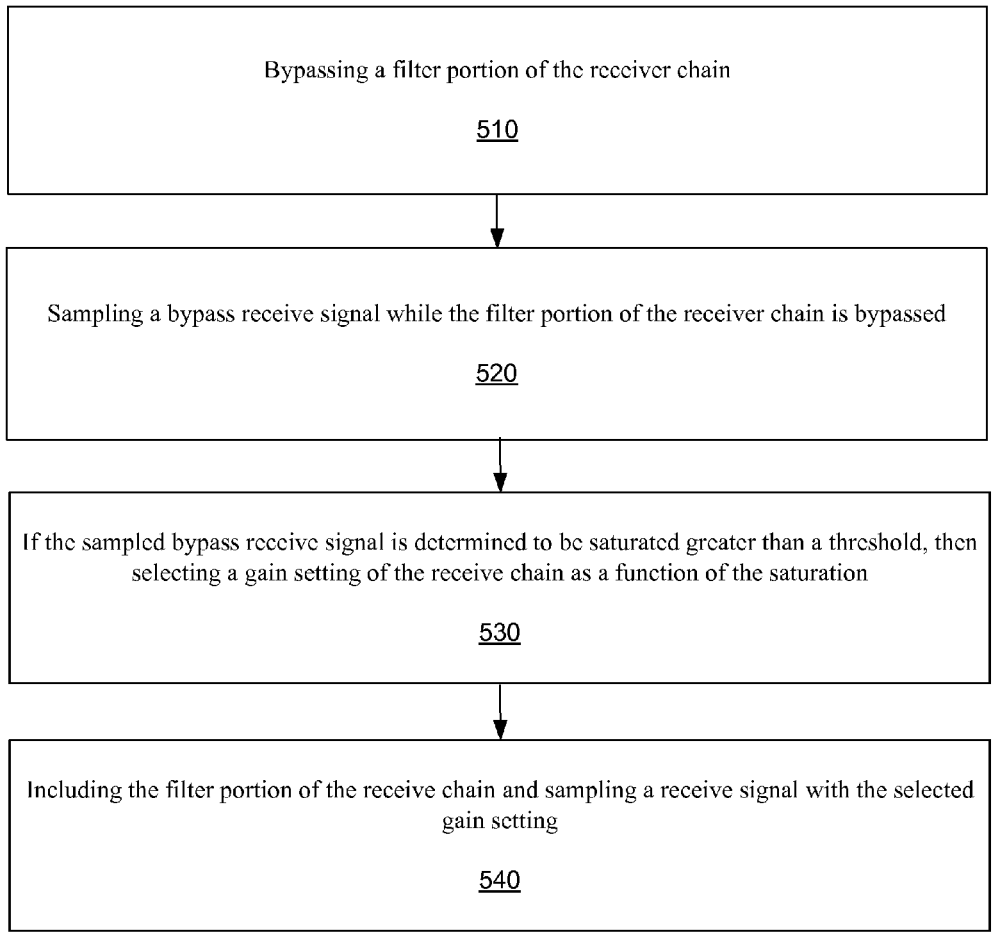
FIG. 5 is a flow chart that includes step of a method of selecting a gain setting of a receiver chain according to an embodiment.

FIG. 5 is a flow chart that includes step of a method of selecting a gain setting of a receiver chain according to an embodiment. A first step 510 includes bypassing a filter portion of the receiver chain. A second step 520 include sampling a bypass receive signal while the filter portion of the receiver chain is bypassed. A third step 530 includes selecting a gain setting of the receive chain as a function of the saturation if the sampled bypass receive signal is determined to be saturated greater than a threshold. A fourth step 540 includes including the filter portion of the receive chain and sampling a receive signal with the selected gain setting.

For at least some embodiments, the receiver chain includes an I channel and a Q channel, and wherein sampling the bypass receive signal while the filter portion of the receiver chain is bypassed includes sampling a one of the I channel and the Q channel while a filter portion of the one of the I channel and the Q channel is bypassed. Embodiments further includes sampling the other one of the I channel and the Q channel that is not bypassed while a filter portion of the other one of the I channel and the Q channel is bypassed. Embodiments further include selecting a second gain setting of the receive chain as a function of the sampled I channel and the sampled Q channel. The second gain setting can be, for example, the gain setting of a VGA (as opposed to the LNA). For a specific embodiment, selecting the second gain setting of the receive chain includes referencing a look-up-table with the sampled I channel and the sampled Q channel, wherein the look-up-table provides the second gain setting.

For at least some embodiments, the selection between I and Q channels is made through the use of a receiver multiplexer. That is, for at least some embodiments, the receiver chain includes a multiplexer that receives inputs from the I channel, the Q channel, a bypassed I channel and a bypassed Q channel, and the sampling of the I channel, the Q channel, the bypassed I channel and the bypassed Q channel is controlled by the multiplexer.

For at least some embodiments, a receive signal of the receiver chain includes packets, and the gain setting of the receiver chain is selected once per packet of the receive signal. The gain setting is typically determined during the preamble portion of the packet which typically is transmitted at the beginning of each packet. If the signal power and/or saturation detected at the ADC output exceed predetermined threshold(s), an automatic gain control (AGC) algorithm is executed to determine the optimum gain setting to receive the remainder of the packet. Since the preamble is typically restricted in time (in order to minimize overhead), the AGC algorithm should converge to the optimum setting with the fewest number of iterations possible. The initial gain used to receive a packet is typically a high gain level such that the lowest power signal to be demodulated by the receiver can be detected by the ADC (i.e. the signal is sufficiently above the quantization floor of the ADC).

Depending on the saturation and signal power detected by the ADC at the start of the packet, the initial gain setting may need to be reduced. The aforementioned embodiments using I and Q components in which one (of the I or Q) bypasses the LPF and one does not bypass LPF, not only allows an assessment of the impact of the out-of-band interference on possible saturation along the receiver chain, but also allows an efficient/fast determination since both the bypass and non-bypass measurements are obtained simultaneously. Faster measurements allows use of more iterations by the AGC algorithm to try different gain settings which can increase the likelihood of finding and setting the optimum gain within the preamble time allocated for the AGC.

For at least some embodiments, selecting the gain setting of the receive chain as a function of the saturation includes referencing a look-up-table with a saturation value, wherein the look-up-table provides the gain setting.

The described embodiments can be extended to MIMO receivers that include multiple receiver chains. Characterizations of one receiver chain can be used to aid the gain settings of another receiver chain of the MIMO receiver. This is possible because received signal strengths may be correlated for proximate receive chains. For example, selecting a gain of a second receiver chain of a multiple receiver chain receiver can be based on the sampling a bypass receive signal.

An embodiment includes the multiple chain receiver establishing a level of correlation between a receive signal of a first receiver chain and a receive signal of a second receiver chain. If the level of correlation is above a predetermined threshold, then the sampled bypass receive signal of the first receive chain and a samples of the non-bypass signal of the second receiver chain can be used to set gains (LNA(s) and VGA(s)) of both the first receiver chain and the second receiver chain. Various methods can be used to determine whether the correlation level between a signal of the first receiver chain and a signal of the second receiver chain exceeds a pre-determined threshold. However, if the correlation exceeds threshold, this embodiment includes using the bypass measurement from the first receiver chain and non-bypass measurement from the second receiver chain to determine gain settings of both chains. Clearly, the first receiver chain can equivalently be sampled in the non-bypass mode and the second receiver chain sampled in the bypass mode.

Exemplary methods for determining the correlation between signals of the different receiver chains of the MIMO (multiple receiver chains) receiver include, for example, 1) comparing average gain settings (of the receiver chains) from previous packets (that is, one gain setting per packet) for the two receiver chains 2) comparing saturation counts from previous packets for the two receiver chains (that is, how often has bypass saturated relative to non-bypass for both chains from previous packets) 3) comparing the level of out of band interference from previous packets present in each of the two receiver chains. More specifically, an embodiment includes determining there to be a level of out-of-band interference that is above a threshold, for example, both receiver chains. Clearly, other methods can additionally or alternatively be used to establish a threshold level of correlation between the receiver chains.

As will be described, for at least some embodiments, selecting the gain setting of the receive chain includes selecting a gain of a low noise amplifier (LNA) of the receive chain and selecting a gain of a variable gain adjust (VGA) of the receive chain. Generally, this includes determining whether the LNA is saturated. If the LNA is saturated, then the gain of the LNA is decrease until the saturation is below a threshold. The gain of the VGA (or VGAs) is then increased to compensate for the decrease in the gain of the LNA.

At least some embodiments further include selecting a digital filtering of the sampled I channel and Q channel (where neither channel has bypassed filter—that is, normal receiver mode) prior to decimation based at least in part on a ratio of powers of the I channel and the Q channel. Specifically, if the bypass channel (the I or Q channel in bypass mode) has sufficiently high received power (greater than a threshold) compared to the non-bypass channel, then out of band interference should be suppressed by the decimation filter (after sampling by the ADC). The suppression may be desired even if the suppression requires a sharp frequency response (at band edge) that introduced ISI (inter-symbol interference) which may slightly degrade SNR. However, if the bypass channel does not have sufficiently high received power compared to the non-bypass channel, then the decimation filter frequency response need not have sharp roll-off at the band-edge, and thereby will not degrade the SNR of the decimated receive signal.

At least some embodiments further include determining an amount of interference suppression required after sampling based at least in part on the sampled I channel and the sampled Q channel while a filter portion of the receiver chain is bypassed.

Figure 6:
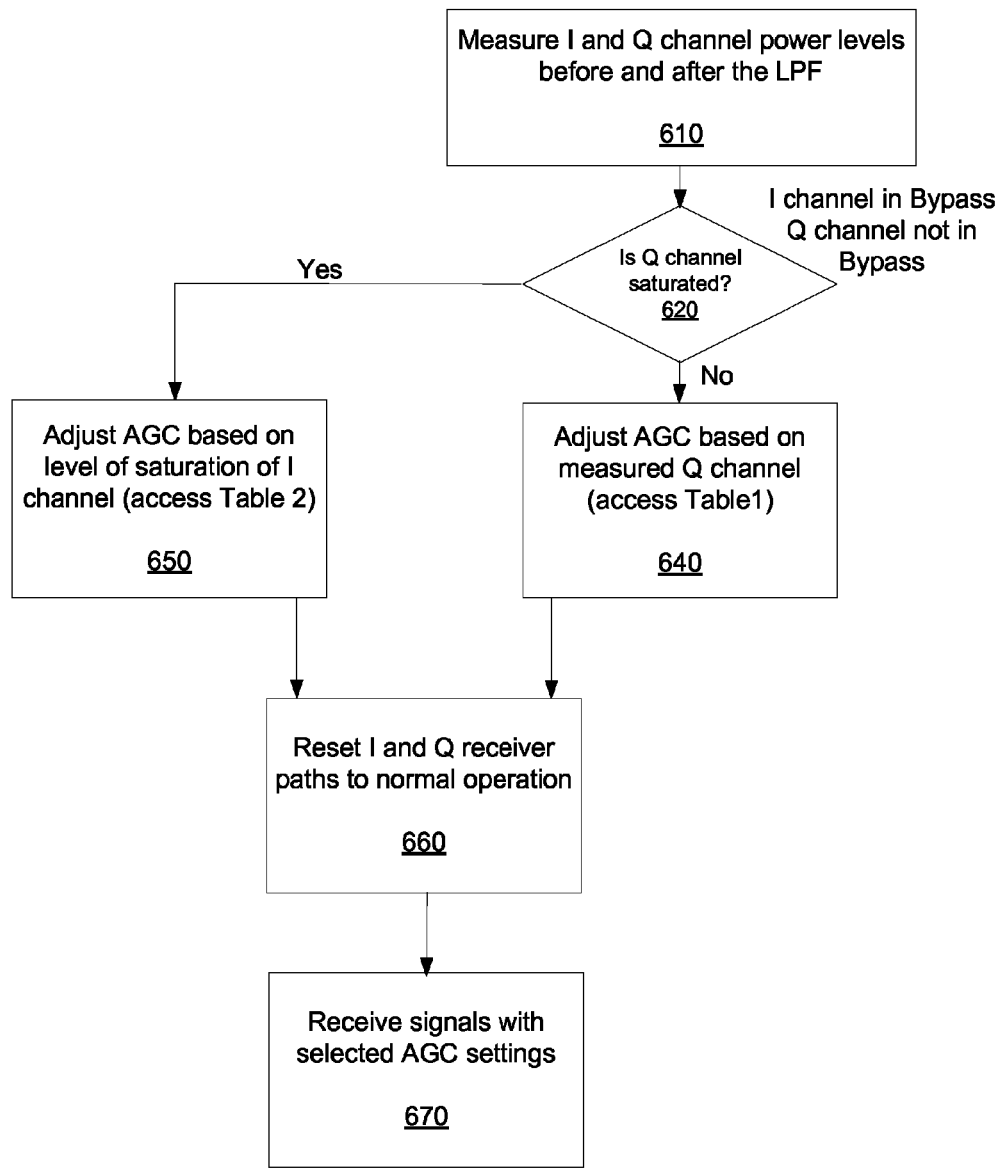
FIG. 6 is a flow chart that includes step of a method of selecting a gain setting of a receiver chain according to another embodiment.

FIG. 6 is a flow chart that includes step of a method of selecting a gain setting of a receiver chain according to another embodiment. A first step 610 includes measuring I and Q channel power levels of the receive signal both before and after a low pass filter of the receive chain. If, for example, the Q channel is the bypassed channel (that is, the LPF of this channel is bypassed) a step 620 includes determining whether the receive signal of the Q channel is saturated. For this embodiment of step 620, the I channel is in the bypass mode and the Q channel is not in the bypass mode. Saturation can be determined is different ways. For example, one embodiment includes saturation being greater than a threshold.

If the Q channel is determined to be saturated, a step 650 includes adjusting the automatic gain control (AGC) which includes the gain settings of the LNA and the VGAs of the receiver chain. For at least some embodiments, gain (or gains) is retrieved by accessing a second LUT that provides the gain setting based upon the level of saturation of the I channel. Clearly, the saturation value can alternatively be based on the I channel if the I channel is alternatively bypassed in step 620.

As previously mentioned, saturation of either the I channel or the Q channel can be determined (measured). Additionally, degrees of saturation can be determined or measured. For an embodiment, the saturation can be determined by counting the number of I OR Q samples measured at the ADC full scale voltage (that is, the voltage biasing the ADC is at a maximum positive or a minimum negative voltage) over a pre-determined time interval. Saturation can be determined by determining whether that count exceeds some pre-determined threshold. An alternate embodiment includes counting number of samples exceeding some pre-determining voltage less than full scale voltage instead of full-scale voltage.

For another embodiment, the saturation can be determined by counting the number of complex I and Q samples at the ADC full scale voltage over a pre-determined time interval and determining whether that count exceeds some pre-determined threshold. An alternate embodiment includes counting number of samples exceeding some pre-determining voltage less than full scale voltage instead of full-scale voltage.

Another embodiment includes calculating the average magnitude or power over a pre-determined time interval and comparing that average against a pre-determined threshold.

If the Q channel receive signal is determine not to be saturated (that is, less than the predetermined threshold), a step 640 includes adjusting the AGC based on a level of saturation of the Q channel receive signal by accessing a look-up-table (LUT).

For an embodiment, the LNA includes a finite number of gain settings. The highest gain setting, for example, optimizes the noise figure and is used for low receive signal strength (RSS) while the lowest gain, for example, minimizes likelihood of saturation for high RSS (either due to interference or the desired receive signal being received at very high power level). For an embodiment, the variable gain adjustment (VGA) includes several stages (such as, VGA stages 250, 260). Each stage has a range of possible values (gain settings) with the resolution being finest at the last stage VGA. The gain range covered by LNA relative to that covered by the VGAs is very implementation/application specific.

If the Q channel receive signal is determined to be saturated, a step 650 includes adjusting the AGC based on a level of saturation of the I channel (the non-bypassed channel) receive signal.

Once the AGC has been selected, a step 660 includes setting both the I and Q channels to be normal—that is, neither of them are in bypass mode.

A step 670 includes the receiver of the receive channel receiving signal with the gain settings as selected.

Figure 7:
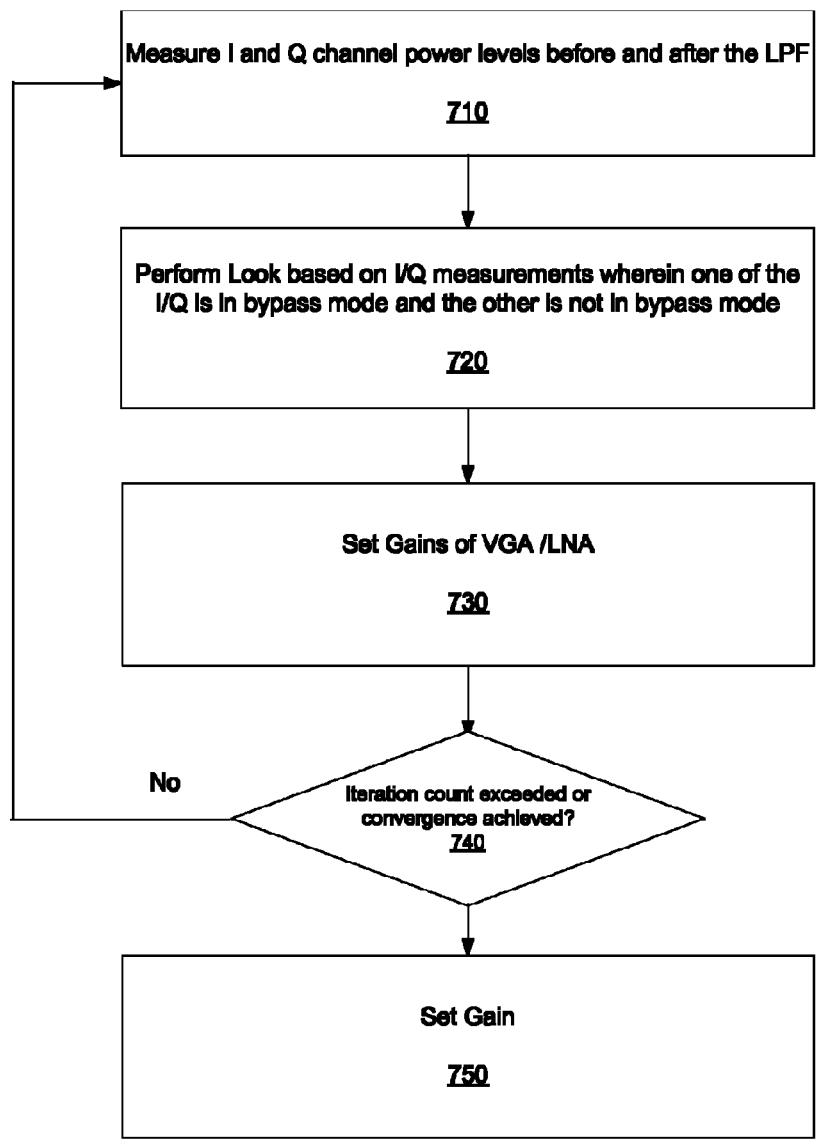
FIG. 7 is a flow chart that includes step of a method of selecting a gain setting of a receiver chain according to another embodiment.

FIG. 7 is a flow chart that includes step of a method of selecting a gain setting of a receiver chain according to another embodiment. A step 710 includes measuring I and/or Q channel receive signals both before and after the receiver chain LPF. A step 720 includes performing a look up (from a LUT) based on the I/Q receive signal measurements, wherein the measurement include one of the I/Q channels in bypass mode and the other of the I/Q channels is not in bypass mode. A step 730 includes setting the VGA/LNA gains based on the I/Q channel receive signal measurements. A step 740 includes determining whether an iteration count (that is, the number of I/Q measurements) has exceeded a preselected number or that a convergence has been achieve. That is, the gain settings have been determined that satisfactorily eliminate the measured saturation. Finally, the gains of the LNA and the VGA(s) are set based on the selected gains.

Determination of Lookup Table Output

For at least some embodiments, the combination of bypass and non-bypass measurements serve as inputs to a lookup table which provides the gain settings of the LNA and VGA(s) as output which are used to adjust the gain settings in the RF chain.

For an embodiment, if there is no saturation (wherein the saturation can be determined as previously described) in the bypass measurement, then no consideration needs to be provided for possible saturation earlier in the Rx chain that may be missed by measuring the signal(s) at the ADC output. Thus, the conventional AGC algorithm(s) based on ADC output measurements may be used (that is, gain settings are derived for each power level measured based on minimizing the impact of thermal noise and minimizing nonlinearities of the desired receive signal given the allowable set of gain settings for the LNA and VGAs).

For an embodiment, if there is saturation (again, wherein the saturation can be determined based on previously described methods) detected in the bypass measurement, then the saturation level can be checked for the non-bypass measurement. If there is sufficient saturation present in the non-bypass measurement, then the analog filter is not preventing proper detection of saturation at ADC output and hence a conventional AGC algorithm(s) based on ADC output measurement may be used to determine the next gain settings.

For an embodiment, if there is saturation in the bypass measurement and insufficient saturation in the non-bypass measurement, then the LNA gain should be reduced. The extent of the reduction depends on the available LNA gain settings and the reduction required to reduce saturation at the output of the LNA. The gain of the VGA(s) should be correspondingly increased based on the amount of gain reduction applied to LNA gain settings.

For at least some embodiments of the receiver chain, additional low pass filters (LPFs) are included between VGAs of the receiver chain. In the same manner that a filter present between the LNA and VGA may prevent accurate saturation detection at the ADC, any filter(s) present between VGAs may produce the same effect. Therefore, once the proper LNA setting has been determined, the bypass/non-bypass simultaneous measurement approach can be used such that these filter(s) are bypassed or not bypassed. A second lookup table can then be used with these bypassed/non-bypassed measurements that will provide the adjustment for the VGA settings only.

At least some embodiments of receiver chains include filtering not only after the down-conversion mixer 230, but also between, for example, the variable gain amplifiers (VGA1, VGA2) 250, 260. As such, it can be desirable to obtain bypass and non-bypass measurements simultaneously from multiple pairs of points in these embodiments of receive chains. That is, the gains of the (VGA1, VGA2) 250, 260 can be selected based at least in part upon bypass and non-bypass modes, wherein the bypass mode bypasses a filter located between, for example, the (VGA1, VGA2) 250, 260 or other gain elements within the receiver chain. However, one ADC for a given receive chain may not sufficient to sample all the desired signals/channels. Therefore, additional ADCs from other receiver chains (such as ADC 870 of FIG. 8) of the same receiver may be used to sample the pair of channels which is different from the pair of channels being sampled by the first receiver. This simultaneous measurement technique of multiple pairs further underscores the advantage of faster convergence compared to the traditional methods of determining gains.

Generation of a Look Up Table (LUT)

At least some embodiments of the LUT receive the bypass and non-bypass measurements as inputs and provide the combination of LNA and VGA settings as outputs. In order to determine the entries of the LUT, a first step of an embodiment includes estimating the received signal strength (RSS) of the signal of interest (SOI) and out of band interference at the input to the LNA. For an embodiment, these estimates are derived based on collection of the bypass and non-bypass saturation measurements for varying values of the RSS of both the SOI and interference. Since the saturation measurements are not exactly reflective of the RSS, there is some estimation error in this mapping. Once this approximate mapping has been completed, for at least some embodiments, the LNA and VGA settings are derived based on balancing the following principles: 1) For at least some embodiments, the LNA gain is set at the highest possible setting without causing saturation of either the SOI or the interference. This setting can be derived based on the aforementioned RSS estimates and the specifications of a design of the LNA, which specifies the various signal levels at which varying degrees of compression/saturation may be expected. 2) Once the LNA gain has been determined, at least some embodiments include distribution the VGA gain among the VGAs to (a) avoid saturation at the intermediate stages based on the same principle as discussed for the LNA based on the design specs and (b) results in a signal level at the ADC which most closely matches the desired signal level at the ADC determined a priori based on characteristics such as peak to average ratio of the received signal.

The LUT entries may be validated by testing the performance of the receiver for varying RSS of the SOI and interference. The entries could be slightly modified (i.e. the gain partitions could be slightly adjusted) and the performance measurement repeated to ensure that the original LUT entries achieve the best performance. Further analysis may be performed to examine the variation in saturation counts (due to randomness of data, LNA/VGA gain sensitivity/variation due to temperature, etc.) for a given RSS of the SOI and interferer, Based on the extent of the variation, the LUT entries may need to be adjusted to handle the extreme cases of the variation (i.e. noise figure may need to be compromised for the typical case in order to prevent saturation for the extreme case). Essentially, this variation in saturation counts even for a given RSS, represents measurement error.

Decimation Filter Selection

The ADC sampling rate is often chosen to be greater than the bandwidth of the signal of interest (SOI) in order to allow digital processing to mitigate out of band interference that may not be sufficiently mitigated by the RF chain. A decimation filter is then applied to the sampled signal to digitally suppress the-out-of-band signal and noise and thus enhance the integrity of the in band SOI. If the frequency response of the filter is very sharp, then considerable ISI can result degrading the quality of the SOI. On the other hand, if the frequency response is not sharp enough, the result is inadequate suppression of the out of band interference.

Therefore, a receiver that is capable of detecting when there is additional suppression of interference required can appropriately choose a filter that appropriate trades off the ISI versus interference impairment suppression. An efficient method for the receiver to determine the amount of interference suppression required is based on the bypass and non-bypass measurements. Based on this pair of measurements and knowledge of the analog filter responses, the baseband receiver can determine the level of interference suppression required and hence choose the appropriate filter design for decimation.

Figure 8:
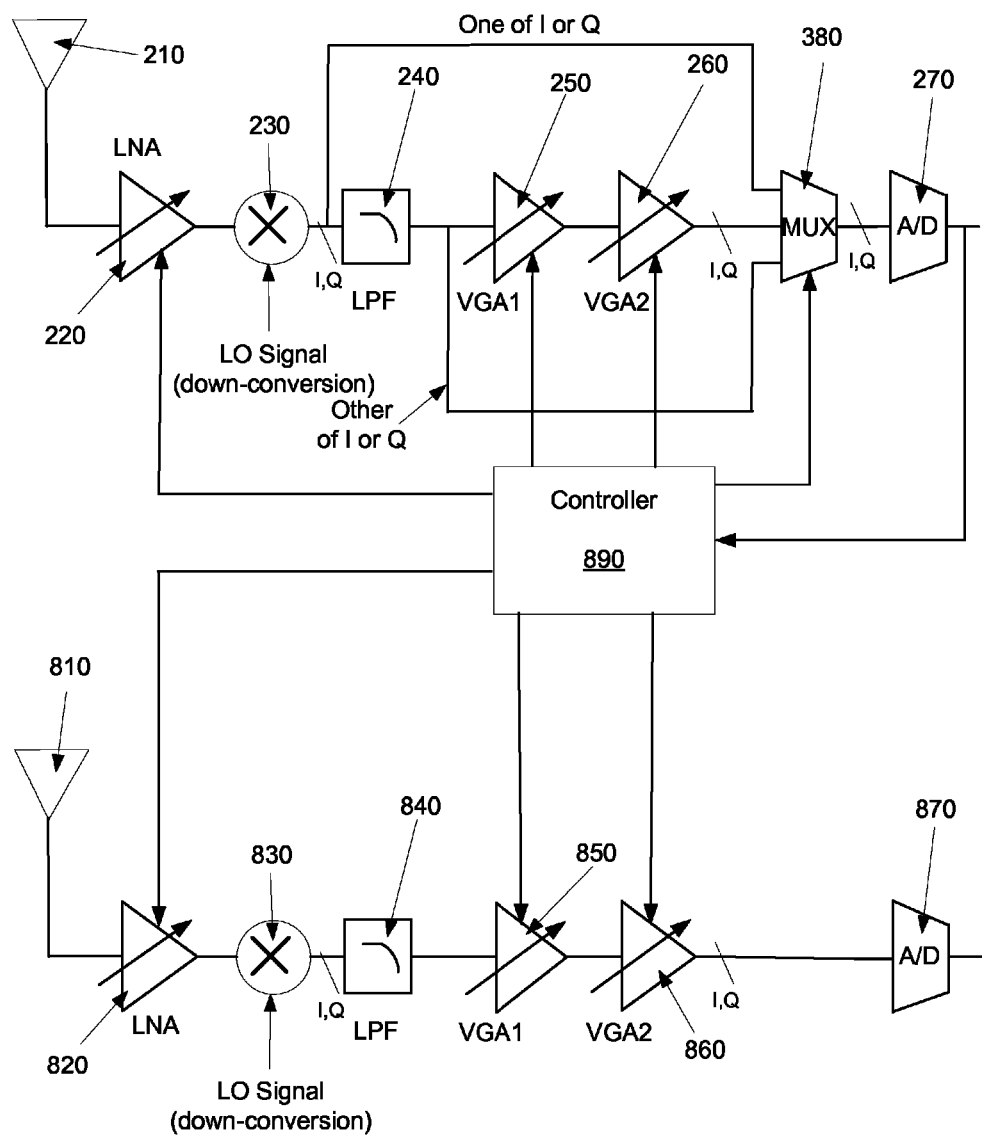
FIG. 8 is a block diagram of a multiple-input, multiple-output (MIMO) receiver that includes multiple receiver chains.

FIG. 8 shows an embodiment of a multiple input, multiple output (MIMO) receiver that include multiple receiver chains. In a MIMO receiver the multiple receive chains can be used to probe other points in each corresponding receiver chain to improve the saturation assessment for the overall receiver. For each chain, the I and Q components can be used independently to measure different signal points as described previously. For example, a second receiver chain that includes an antenna 810, LNA 820, down conversion mixer 830, LPF 840, VGA1 850, VGA2 860 and ADC 870 can be at least partially controlled by I and/or Q bypass measurements of a first receiver chain. That is, a controller 890 that obtains the I and/or Q bypass measurements of a first receiver chain can control the LNA 820 and/or the VGAs 850, 860 of the second receiver chain based at least in part on the I and/or Q bypass measurements (at, for example, the ADC 270) of a first receiver chain.

As previously described, an embodiment includes the multiple chain receiver establishing a level of correlation between a receive signal of a first receiver chain and a receive signal of a second receiver chain. If the level of correlation is above a threshold, then the sampled of a bypass receive signal of the first receiver chain and a samples of a non-bypass signal of the second receiver chain can be used to set gains of both the first receiver chain and the second receiver chain. Such an embodiment allows for efficient selection of the gain settings of each of the receiver chains. That is, the level of saturation measurements of bypass and non-bypass modes of each of the receiver chains can be made time efficiently, which allows for selection of the gain settings of the receiver chain to be made time efficiently. Alternatively, if the same amount of time is used as used in conventional methods to set the gains, more accurate gain settings can be achieved since more iterations of gain settings and measurements to re-adjust the gains can be completed in a given amount of time given the improved efficiency with the simultaneous bypass/non-bypass measurements.

Although specific embodiments have been described and illustrated, the embodiments are not to be limited to the specific forms or arrangements of parts so described and illustrated.

What is claimed:

1. A method of selecting a gain setting of a receiver chain, comprising:

bypassing a filter portion of a one of an I channel and a Q channel of the receiver chain;

sampling a bypass receive signal of the one of the I channel and the Q channel while a filter portion of the one of the I channel and the Q channel is bypassed, and sampling another one of the I channel and the Q channel that is not bypassed;

if the sampled bypass receive signal of the one of the I channel and the Q channel is determined to be saturated greater than a threshold, then selecting a gain setting of the receiver chain as a function of the saturation; and including the filter portion of the receiver chain and sampling a receive signal with the selected gain setting.

2. The method of claim 1, further comprising selecting a second gain setting of the receiver chain as a function of the sampled I channel and the sampled Q channel.

3. The method of claim 1, wherein selecting the second gain setting of the receiver chain comprises referencing a look-up-table with the sampled I channel and the sampled Q channel, wherein the look-up-table provides the second gain setting.

4. The method of claim 1, wherein a receiver analog-to-digital-converter (ADC) performs sampling of the bypass receive signal and sampling of the receive signal.

5. The method of claim 1, wherein the receiver chain comprises a multiplexer that receives inputs from the I channel, the Q channel, at least one of a bypassed I channel and a bypassed Q channel, and the sampling of the I channel, the Q channel, and the at least one of the bypassed I channel and the bypassed Q channel is controlled by the multiplexer.

6. The method of claim 1, further comprising selecting a gain of a second receiver chain of a multiple receiver chain receiver based on the sampling a bypass receive signal, wherein the multiple receiver chain includes the receiver chain and the second receiver chain.

7. The method of claim 1, wherein selecting a gain setting of the receiver chain comprises selecting a gain of a low noise amplifier (LNA) of the receiver chain and selecting a gain of a variable gain adjust (VGA) of the receiver chain.

8. The method of claim 1, further comprising determining an amount of interference suppression required after sampling based at least in part on the sampled I channel and the sampled Q channel while a filter portion of the receiver chain is bypassed.

9. A method of selecting a gain setting of a receiver chain, comprising:
bypassing a filter portion of the receiver chain;
sampling a bypass receive signal while the filter portion of the receiver chain is bypassed;
if the sampled bypass receive signal is determined to be saturated greater than a threshold, then selecting a gain setting of the receiver chain as a function of the saturation; and
including the filter portion of the receiver chain and sampling a receive signal with the selected gain setting;
wherein a receive signal of the receiver chain includes packets, and the gain setting of the receiver chain is selected once per packet of the receive signal.

10. A method of selecting a gain setting of a receiver chain, comprising:
bypassing a filter portion of the receiver chain;
sampling a bypass receive signal while the filter portion of the receiver chain is bypassed;
if the sampled bypass receive signal is determined to be saturated greater than a threshold, then selecting a gain setting of the receiver chain as a function of the saturation; and
including the filter portion of the receiver chain and sampling a receive signal with the selected gain setting;
wherein selecting the gain setting of the receiver chain as a function of the saturation comprises referencing a look-up-table with a saturation value, wherein the look-up-table provides the gain setting.

11. A method of selecting a gain setting of a receiver, comprising:
bypassing a filter portion of a first receiver chain of the receiver;
sampling a bypass receive signal while the filter portion of the first receiver chain is bypassed;
if the sampled bypass receive signal is determined to be saturated greater than a threshold, then selecting a gain setting of the first receiver chain as a function of the saturation;
including the filter portion of the first receiver chain and sampling a receive signal with the selected gain setting;
selecting a gain of a second receiver chain of the receiver based on the sampled bypass receive signal; and
establishing a level of correlation between a receive signal of the first receiver chain and a receive signal of the second receiver chain, and if the level of correlation is above a threshold, then using the sampled bypass receive signal and samples of a non-bypass signal of the second receiver chain to set gains of both the first receiver chain and the second receiver chain.

12. A method of selecting a gain setting of a receiver chain, comprising:
bypassing a filter portion of the receiver chain;
sampling a bypass receive signal while the filter portion of the receiver chain is bypassed;
if the sampled bypass receive signal is determined to be saturated greater than a threshold, then selecting a gain setting of the receiver chain as a function of the saturation;
including the filter portion of the receiver chain and sampling a receive signal with the selected gain setting;
wherein the receiver chain includes an I channel and a Q channel, and wherein sampling the bypass receive signal while the filter portion of the receiver chain is bypassed comprises sampling a one of the I channel and the Q channel while a filter portion of the one of the I channel and the Q channel is bypassed; and
further comprising selecting a digital filtering of the sampled one of the I channel and the Q channel prior to decimation based at least in part on a ratio of powers of the I channel and the Q channel.

13. A receiver, comprising:
a receiver chain, the receiver chain comprising;
an I channel and a Q channel;
a receiver sampler;
a controller operative to control bypassing of a filter portion of a one of the I channel and the Q channel, and receive samples of the one of the I channel and the Q channel while the filter portion of the one of the I channel and the Q channel is bypassed, and samples of the other one of the I channel and the Q channel that is not bypassed, from the receiver sampler, wherein if a sampled signal of the one of the I channel and the Q channel while the filter portion the one of the I channel and the Q channel is bypassed is determined to be saturated greater than a threshold, then selecting a gain setting of the receiver chain as a function of the saturation;
the controller further operative to include the filter portion of the one of the I channel and the Q channel of the receiver chain and set the receiver chain to the selected gain setting for receiving a receive signal.

14. The receiver of claim 13, wherein the receive signal of the receiver chain includes packets, and the gain setting of the receiver chain is selected once per packet of the receive signal.

15. The receiver of claim 13, wherein selecting the gain setting of the receiver chain as a function of the saturation comprises referencing a look-up-table with a saturation value, wherein the look-up-table provides the gain setting.

16. The receiver of claim 13, further comprising selecting a second gain setting of the receiver chain as a function of the sampled I channel and the sampled Q channel.

17. The receiver of claim 16, wherein selecting the second gain setting of the receiver chain comprises referencing a look-up-table with the sampled I channel and the sampled Q channel, wherein the look-up-table provides the second gain setting.

18. The receiver of claim 13, wherein the receiver chain comprises a multiplexer that receives inputs from the I channel, the Q channel, a bypassed I channel and a bypassed Q channel, and the sampling of the I channel, the Q channel, the bypassed I channel and the bypassed Q channel is controlled by the multiplexer.

19. The receiver of claim 13, further comprising selecting a gain of a second receiver chain of the receiver based on the sampling a bypass receive signal.

20. The receiver of claim 19, further comprising the controller operative to establish a level of correlation between a receive signal of the receiver chain and a receive signal of the second receiver chain, and if the level of correlation is above a threshold, then the controller is operative to use the sampled bypass receive signal and samples of a non-bypass signal of the second receiver chain to set gains of both the receiver chain and the second receiver chain.

21. The receiver of claim 19, wherein the controller establishing a level of correlation between a receive signal of the receiver chain and a receive signal of the second receiver chain comprises the controller operative to establish a level of out-of-band interference above a threshold for the receive signal of the receiver chain and a receive signal of the second receiver chain.

* * * * *

UNITED STATES PATENT AND TRADEMARK OFFICE
CERTIFICATE OF CORRECTION

| | | |
|---|---|---|
| PATENT NO. | : 8,737,545 B2 | Page 1 of 1 |
| APPLICATION NO. | : 13/326248 | |
| DATED | : May 27, 2014 | |
| INVENTOR(S) | : Chari et al. | |

It is certified that error appears in the above-identified patent and that said Letters Patent is hereby corrected as shown below:

In the claims

In Column 12, Line 35, delete "the filter portion the one of" and insert -- the filter portion of the one of --, therefor.

In Column 12, Line 67, delete "sampling a bypass receive signal." and insert -- sampling of a bypass receive signal. --, therefor.

Signed and Sealed this
Twenty-fourth Day of May, 2016

Michelle K. Lee
*Director of the United States Patent and Trademark Office*